United States Patent
Matsuoka et al.

(10) Patent No.: US 7,616,673 B2
(45) Date of Patent: Nov. 10, 2009

(54) SEMICONDUCTOR LASER DEVICE

(75) Inventors: Hiromasu Matsuoka, Hyogo (JP); Yasuyuki Nakagawa, Tokyo (JP); Toshihiko Shiga, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 395 days.

(21) Appl. No.: 11/439,276

(22) Filed: May 24, 2006

(65) Prior Publication Data

US 2007/0053398 A1 Mar. 8, 2007

(30) Foreign Application Priority Data

Sep. 5, 2005  (JP) ............... 2005-256833

(51) Int. Cl.
*H01S 5/00* (2006.01)
(52) U.S. Cl. ............ 372/49.01; 372/98; 372/99; 372/103; 372/108
(58) Field of Classification Search ............ 372/49.01, 372/98, 99, 103, 108
See application file for complete search history.

(56) References Cited

U.S. PATENT DOCUMENTS

| | | | |
|---|---|---|---|
| 6,396,864 B1 | 5/2002 | O'Brien et al. | |
| 6,487,227 B1 | 11/2002 | Kuramachi | |
| 6,618,409 B1 | 9/2003 | Hu et al. | |
| 6,628,689 B2 * | 9/2003 | Okada et al. | 372/49.01 |
| 2003/0156614 A1 | 8/2003 | Ueda et al. | |
| 2003/0183833 A1 * | 10/2003 | Osaka | 257/98 |
| 2003/0210722 A1 | 11/2003 | Arakida et al. | |
| 2004/0190576 A1 | 9/2004 | Matsuoka et al. | |
| 2004/0213314 A1 | 10/2004 | Kunitsugu et al. | |
| 2004/0233959 A1 * | 11/2004 | Arakida | 372/49 |
| 2004/0238828 A1 | 12/2004 | Ito | |
| 2005/0127383 A1 | 6/2005 | Kikawa et al. | |

FOREIGN PATENT DOCUMENTS

| | | |
|---|---|---|
| JP | 03-259585 | 11/1991 |
| JP | 2000-068586 | 3/2000 |
| JP | 2001-119096 | 4/2001 |
| JP | 2004-296903 | 10/2004 |
| JP | 2004-327581 | 11/2004 |

* cited by examiner

*Primary Examiner*—Minsun Harvey
*Assistant Examiner*—Yuanda Zhang
(74) *Attorney, Agent, or Firm*—Leydig, Voit & Mayer, Ltd.

(57) ABSTRACT

A semiconductor laser device includes a semiconductor laser body including a resonator and having a front end face and a rear end face facing each other, the resonator being located between the front end face and the rear end face. The front end face emits principal laser light. A reflectance control film is disposed on the front end face or the rear end face of the semiconductor laser body and is made up of either an aluminum oxide film or a five-layer film including the aluminum oxide film disposed such that it is the layer in the five-layer film farthest from the front end face or the rear end face. A silicon oxide film is disposed on the aluminum oxide film of the reflectance control film and has a thickness of 20 nm or less.

7 Claims, 7 Drawing Sheets

SEMICONDUCTOR LASER DEVICE

BACKGROUND OF THE INVENTION

1. Field of the Invention

The present invention relates to a semiconductor laser device for use in, for example, electronic information devices, and more particularly to a semiconductor laser device in which reflectance control films are provided on the end faces of the resonator.

2. Description of the Related Art

In a semiconductor laser, laser oscillation is produced between the front and rear end faces of the resonator so as to emit a laser beam from the front end face, for example. In order to efficiently emit the laser beam, reflectance control films are provided on the front and rear end faces of the resonator to appropriately adjust the reflectance of these end faces.

Specifically, the reflectance control film provided on the front end face is a dielectric film formed so as to reduce the reflectance of the front end face. The reflectance control film on the rear end face, on the other hand, is a dielectric film formed so as to increase the reflectance of the rear end face.

Aluminum oxide films or multilayer films including an aluminum oxide film are used as these dielectric films.

Aluminum oxide has substantially the same coefficient of linear expansion as GaAs, which is a constituent material of semiconductor lasers. Therefore, when an aluminum oxide film is formed on a GaAs surface as a dielectric film, they securely adhere to each other. Furthermore, aluminum oxide has high thermal conductivity. Because of these advantages, an aluminum oxide film is used as a first layer dielectric film adhered to a resonator formed of GaAs.

Especially, a single layer aluminum oxide film is used as a reflectance control film having low reflectance provided on the light emitting front end face of the resonator. Use of a single layer aluminum oxide film is advantageous in that: the reflectance of the film can be set to a desired value by adjusting its thickness; and the manufacturing process can be shortened, as compared to multilayer configurations in which a plurality of layers are laminated to one another.

On the other hand, a reflectance control film having high reflectance is provided on the rear end face of the resonator. A multilayer film formed of aluminum oxide and silicon is used as this reflectance control film having high reflectance. Since aluminum oxide exhibits good adhesion to a GaAs surface, an aluminum oxide film having a thickness corresponding to an optical length of an integer multiple of $\lambda/4$ is used as the first layer dielectric film of the multilayer film adhered to the rear end face of the resonator, where $\lambda$ is the wavelength of the laser beam. It should be noted that layers sequentially formed on an end face of the resonator are hereinafter referred to as a first layer, a second layer, a third layer, and so on, and the last layer, or the outermost layer, in contact with the external medium is hereinafter referred to as the top surface layer.

The second layer dielectric film formed on the first layer dielectric film is selected to be a silicon film having a thickness corresponding to an optical length of $\lambda/4$. Further, the third and fourth layer dielectric films formed on this silicon film are selected to be an aluminum oxide film and a silicon film, respectively, having a thickness corresponding to an optical length of $\lambda/4$. Further, an aluminum oxide film having a thickness corresponding to an optical length of $\lambda/4$ is formed as the fifth layer dielectric film in contact with the external medium (for example, air).

However, when an aluminum oxide film is placed in an elevated temperature and humidity environment for a certain period of time, moisture enters the film, thereby greatly changing the reflectance of the film from its initial value observed immediately after the formation of the film. Likewise, under the same conditions, moisture also enters an aluminum nitride film, thereby greatly changing the reflectance of the film from its initial value observed immediately after the formation of the film.

If the semiconductor laser is used in a hermetically-sealed inert gas or dry air environment, such penetration of moisture into the aluminum oxide film or aluminum nitride film need not be taken into account. Otherwise, however, moisture may enter these films in high ambient humidity.

If the semiconductor laser is caused to oscillate in a high humidity environment, the reflectance of the aluminum oxide film changes as the temperature of the front end region of the semiconductor laser increases, adversely affecting the output characteristics of the semiconductor laser. Furthermore, the change in the reflectance and in the film quality of the aluminum oxide film may lead to COD (Catastrophic Optical Damage) degradation of the emitting end face of the semiconductor laser.

COD degradation refers to a phenomenon in which a film formed on an end face of a semiconductor laser resonator generates heat and thereby heats up as a result of absorbing the laser beam, leading to melting of the film and eventually to a breakdown of the resonator end face.

In one known example of a configuration of a reflectance control film, the end face protective film (or reflectance control film) on the laser light emitting end face side of a semiconductor laser chip includes: a first layer $Al_2O_3$ film having a thickness corresponding to an optical length of $\lambda/4$; a second layer $SiO_2$ film having a thickness corresponding to an optical length of $\lambda/4$; a third layer $Al_2O_3$ film having a thickness corresponding to an optical length of $\lambda/4$; and a fourth layer $SiO_2$ film having a thickness corresponding to an optical length of $\lambda/4$. (See, for example, the upper-right column on page 2 and FIG. 1 of Japanese Patent Laid-Open No. 3-259585 (1991).)

In another known example, the low reflective film on the laser light emitting end face side of a red semiconductor laser chip having an oscillation wavelength $\lambda$ of 660 nm includes: a first layer $Al_2O_3$ film having a refractive index n1 of 1.638 and a thickness corresponding to an optical length of $\lambda/4$; second and fourth layer $SiO_2$ films having a refractive index (n2, n4) of 1.489 and a thickness corresponding to an optical length of $\lambda/4$; and a third layer $Ta_2O_5$ film having a refractive index n3 of 2.063 and a thickness corresponding to an optical length of $\lambda/4$. (See, for example, paragraphs [0019] to [0020] and FIG. 1 of Japanese Patent Laid-Open No. 2004-296903.)

In still another known example, the high reflective film on the rear end face of a semiconductor laser chip includes: a first layer $Al_2O_3$ film having a thickness corresponding to an optical length of $\lambda/2$; a second layer $SiO_2$ film having a thickness corresponding to an optical length of $\lambda/4$; a third layer $Ta_2O_5$ film having a thickness corresponding to an optical length of $\lambda/4$; a fourth layer $SiO_2$ film having a thickness corresponding to an optical length of $\lambda/4$; a fifth layer $Ta_2O_5$ film having a thickness corresponding to an optical length of $\lambda/4$; a sixth layer $SiO_2$ film having a thickness corresponding to an optical length of $\lambda/4$; a seventh layer $Ta_2O_5$ film having a thickness corresponding to an optical length of $\lambda/4$; and an eighth layer $SiO_2$ film having a thickness corresponding to an optical length of $\lambda/2$. (See, for example, paragraphs [0040] to [0047] and FIG. 3 of Japanese Patent Laid-Open No. 2004-327581.)

In yet another known example, the multilayer film formed on the front end face of the resonator of a semiconductor laser having an oscillation wavelength of 800 nm includes: a first layer $Al_2O_3$ dielectric film having a thickness of d1 and a refractive index n1; a second layer $TiO_2$ dielectric film having a thickness of d2 and a refractive index of n2; and a third layer $SiO_2$ dielectric film having a thickness of d3 and a refractive index of n3. With this arrangement, in order to set the reflectance of the front end face to 13%, the thicknesses and the refractive indices of these dielectric films are set such that n1*d1=0.095, n2*d2=0.20*λ, and n3*d3=0.235. (See, for example, paragraphs [0023] to [0024] and FIG. 2 of Japanese Patent Laid-Open No. 2001-119096.)

Still another known example relates to an optical transmission device including a nonhermetic optical module in which silicon oxide films are formed on device end faces as oxidation inhibiting films. Since such a device cannot achieve (without special arrangement) sufficient resistance to device degradation under elevated temperature and humidity conditions, the following manufacturing method is used assuming that the layer in contact with the external medium is formed of a silicon nitride film. First, a device having a resonator length of 600 μm is produced through a cleaving process. Then, a reflective film having a reflectance of 95% is formed on the rear end face. This film includes three laminated bodies, each made up of a silicon oxide film having a thickness of $\lambda/(4n_{SiO2})$ and an amorphous silicon film having a thickness of $\lambda/(4n_{a-si})$, where λ is the oscillation wavelength. After that, a silicon nitride film is formed to a thickness of $\lambda/(2n_{SiNx})$. As for the front end face, a laminated body formed of a silicon oxide film and an amorphous silicon film such as those described above in connection with the rear end face is formed on the front end face. (This laminated body has a reflectance of 70%.) After that, a silicon nitride film is formed to a thickness of $\lambda/(2n_{SiNx})$, as in the case of the rear end face. (See, for example, paragraphs [0007], [0008], and [0012], paragraphs [0028] to [0030], and FIG. 1 of Japanese Patent Laid-Open No. 2000-68586.)

When the reflectance control film on an end face of a resonator is a single layer film of aluminum oxide or aluminum nitride, or when it is a multilayer film including an aluminum oxide film or aluminum nitride film as its top surface layer film, moisture tends to enter the top surface layer film and thereby change its reflectance, as described above, increasing the possibility of COD degradation.

On the other hand, when the reflectance control film is a multilayer film and its top surface layer film is a film having higher moisture resistance than aluminum oxide and aluminum nitride films, for example, a silicon oxide film, COD degradation, due to the change in the reflectance of the top surface layer film caused as a result of moisture entering the top surface layer film, does not necessarily occur. However, since the top surface layer film also constitutes the reflectance control film, it must have a certain thickness, for example, a thickness corresponding to an optical length of λ/4 or λ/2. In this case, if the top surface layer film has lower thermal conductivity than the aluminum oxide or aluminum nitride film under it, the top surface layer film does not provide as much thermal diffusion as the underlayer film, resulting in an increased possibility of COD degradation. Further, it is difficult to select materials for a multilayer film which has a desired reflectance and whose top surface layer film has high moisture resistance, resulting in a greatly reduced degree of freedom in the design of the reflectance control film.

SUMMARY OF THE INVENTION

The present invention has been devised to solve the above problems. It is, therefore, a first object of the present invention to provide a semiconductor laser device in which surface films having a simple configuration and a reduced tendency to suffer COD degradation are provided on the end faces of the resonator to achieve high reliability.

According to one aspect of the invention, there is provided a semiconductor laser device according to the present invention comprises: a semiconductor laser body including a resonator and having a front end face and a rear end face facing each other, the resonator formed between the front and rear end faces, the front end face emitting principal laser light; a reflectance control film located on the front or rear end face of the semiconductor body and made up of either a first dielectric film having a first thermal conductivity or a multilayer film including the first dielectric film located such that it is the farthest one of the layers in the multilayer film from the front or rear end face; and a surface protective film located on said first dielectric film of the reflectance control film and having a thickness of 20 nm or less and a second thermal conductivity different from the first thermal conductivity.

Accordingly, in the semiconductor laser device according to the present invention, the surface protective film disposed on the reflectance control film shields the reflectance control film from the external medium without changing the reflectance of the reflectance control film, thereby preventing the change in the reflectance of the reflectance control film due to a change in the external environment. Further, even if the surface protective film has low thermal conductivity, the entire surface film including the reflectance control film and the surface protective film is allowed to maintain good heat dissipation characteristics by reducing the thickness of the surface protective film, resulting in reduced COD degradation of the semiconductor laser. Further, the reflectance control film and the surface protective film are made up of two separate films, namely the reflectance control film and the surface protective film which does not affect the reflectance of the reflectance control film. This increases the degree of freedom in the design of the reflectance control film and the surface protective film. Thus, it is possible to provide a semiconductor laser device in which surface films having a simple configuration and a reduced tendency to suffer COD degradation are provided on the end faces of the resonator to achieve high reliability.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

First Embodiment

Figure 1:
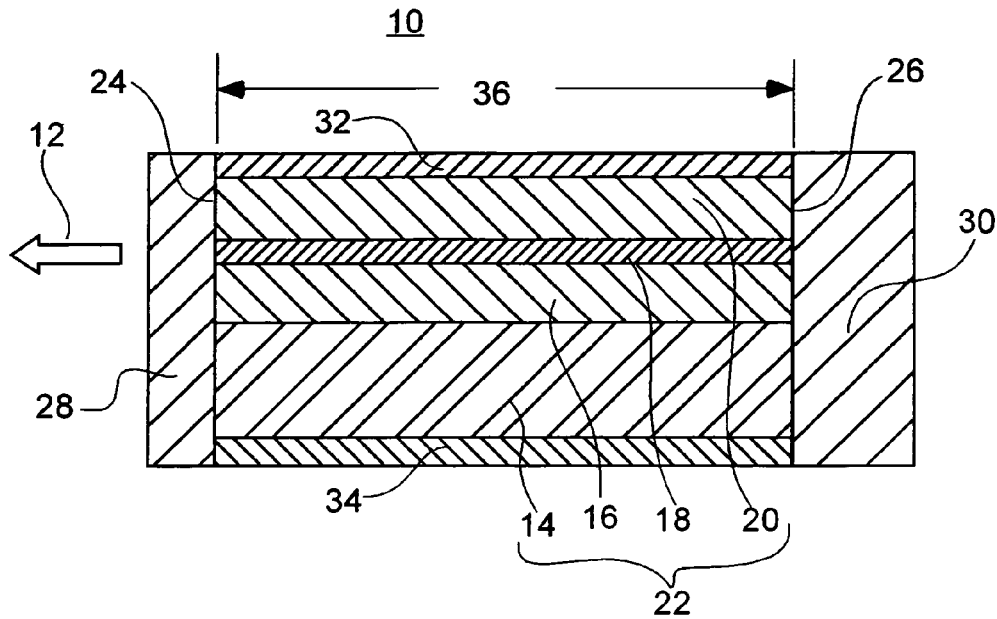
FIG. 1 is a cross-sectional view of a semiconductor laser according to one embodiment of the present invention.

FIG. 1 is a cross-sectional view of a semiconductor laser according to one embodiment of the present invention. It should be noted that like numerals indicate like or corresponding components throughout FIG. 1 and the following figures.

Specifically, FIG. 1 shows a cross section of a semiconductor laser 10 taken along a plane parallel to the waveguide direction of the semiconductor laser. In the figure, the arrow indicates exiting light 12 from the semiconductor laser 10.

The semiconductor laser 10 may be, for example, a red semiconductor laser having an oscillation wavelength of 660 nm.

The semiconductor laser 10 includes an n-type GaAs substrate 14, an n-type cladding layer 16, an active layer 18, and a p-type cladding layer 20. The n-type cladding layer 16, the active layer 18, and the p-type cladding layer 20, which together constitute a resonator 22, are sequentially formed over the n-type GaAs substrate 14. Further, a p-electrode 32 is disposed on the top surface of the p-type cladding layer 20, and an n-electrode 34 is disposed on the back surface of the GaAs substrate 14.

A semiconductor body 36 is made up of the GaAs substrate 14, the resonator 22 formed on the GaAs substrate 14, the p-electrode 32, and the n-electrode 34. The equivalent refractive index of the semiconductor laser body 36 is, for example, 3.817.

In this example, the cleaved surface that includes the end face of the resonator 22 emitting principal laser light is assumed to coincide with the front end face 24 of the semiconductor laser body 36. On the other hand, the cleaved surface facing the front end face 24 across the semiconductor laser body 36 is assumed to coincide with the rear end face 26 of the semiconductor laser body 36. Further, a front surface film 28 is adherently formed on the surface of the front end face 24 of the semiconductor laser body 36, while a rear surface film 30 is adherently formed on the rear end face 26 of the semiconductor laser body 36.

Figure 2:
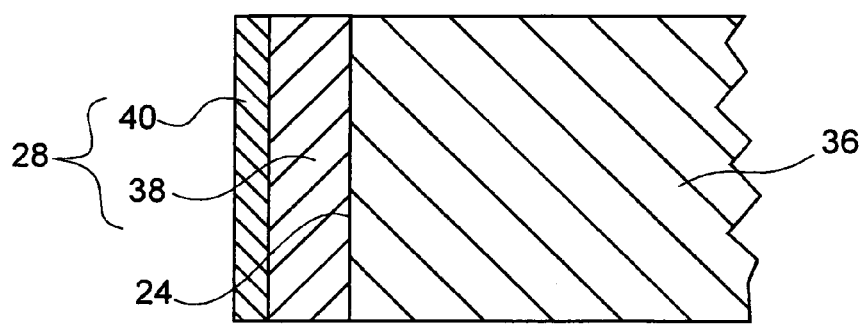
FIG. 2 is a partial cross-sectional view of the front surface film and its neighboring region in the semiconductor laser of one embodiment of the present invention.

FIG. 2 is a partial cross-sectional view of the front surface film and its neighboring region in the semiconductor laser of one embodiment of the present invention.

As shown in FIG. 2, the first layer film of the front surface film 28, which is disposed to provide low reflectance of approximately 3%, is an aluminum oxide film 38. The aluminum oxide film 38 is a first dielectric film acting as a reflectance control film, and is adherently formed on the front end face 24 of the semiconductor laser body 36. It has a refractive index of 1.65 and a thickness of 100 nm corresponding to an optical length of $\mu/4$.

A silicon oxide (SiOx) film 40 is adherently formed on the aluminum oxide film 38 as a surface protective film. It has a refractive index of 1.45 and a thickness of, for example, 5 nm.

Figure 3:
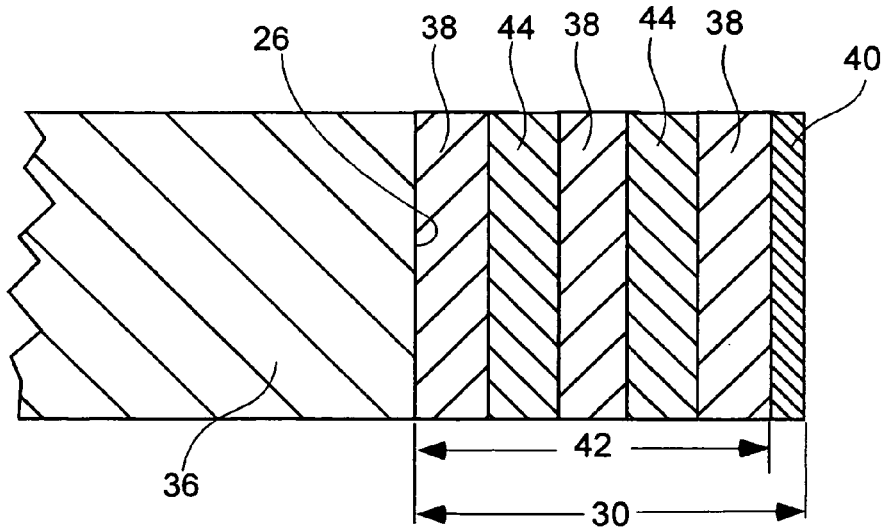
FIG. 3 is a partial cross-sectional view of the rear surface film and its neighboring region in the semiconductor laser of one embodiment of the present invention.

FIG. 3 is a partial cross-sectional view of the rear surface film and its neighboring region in the semiconductor laser of one embodiment of the present invention.

As shown in FIG. 3, the rear surface film 30, which is disposed to provide high reflectance of approximately 75%, includes: a five-layer film 42 as a reflectance control film adherently formed on the rear end face 26 of the semiconductor laser body 36; and a silicon oxide film 40 as a surface protective film adherently formed on the five-layer film 42.

The five-layer film 42 includes an aluminum oxide film 38 as a first layer dielectric film adherently formed on the semiconductor laser body 36. The aluminum oxide film 38 has good adhesion to GaAs. It has a refractive index of 1.65 and a thickness of 100 nm corresponding to an optical length of $\lambda/4$.

The five-layer film 42 further includes a silicon film 44 as a second layer dielectric film. The silicon film 44 has a refractive index of 3.0 and a thickness of 55 nm corresponding to an optical length of $\lambda/4$.

The five-layer film 42 still further includes third to fifth layer dielectric films. The third and fifth layer dielectric films are similar to the first layer aluminum oxide film 38, and the fourth layer dielectric film is similar to the second layer silicon film 44.

In the semiconductor laser 10 configured as described above, a high potential is applied to the p-electrode 32 while a low potential is applied to the n-electrode 34. This excites laser oscillation in the resonator 22 between the low reflectance front surface film 28 and the high reflectance rear surface film 30, thereby emitting a laser beam from the front end face 24 of the semiconductor laser body 36 through the front surface film 28.

Figure 4:
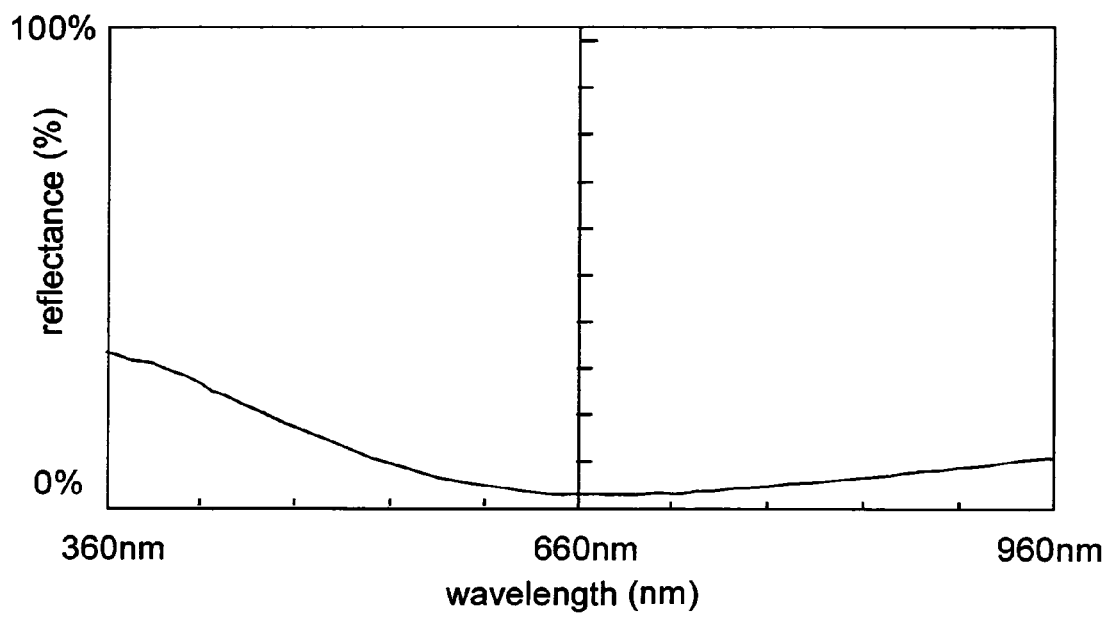
FIG. 4 is a graph showing the wavelength dependence of the reflectance of the front end of a semiconductor laser according to one embodiment of the present invention, wherein an aluminum oxide film is formed on the front end face and a silicon oxide film is formed on the aluminum oxide film.

FIG. 4 is a graph showing the wavelength dependence of the reflectance of the front end of a semiconductor laser according to one embodiment of the present invention, wherein an aluminum oxide film is formed on the front end face and a silicon oxide film is formed on the aluminum oxide film.

A single layer aluminum oxide film has good characteristics as a reflectance control film, since its reflectance can be relatively freely adjusted by controlling its thickness. However, this material does not necessarily provide satisfactory moisture resistance in an elevated temperature and humidity environment. Therefore, a silicon oxide film, which has higher moisture resistance, is formed on the aluminum oxide film as a surface protective film.

As shown in FIG. 4, when the aluminum oxide film 38 and the silicon oxide film 40 are formed on the front end face of the semiconductor laser, the front end has a reflectance of 2.9% to 660 nm wavelength light generated.

For comparison, when only the aluminum oxide film is formed on the front end face of the semiconductor laser, the front end has a reflectance of 2.8% to 660 nm wavelength light and the wavelength dependence characteristic curve of the reflectance of the front end is approximately identical to that shown in FIG. 4.

This means that forming the approximately 5 nm thick silicon oxide film 40 on a reflectance control film, in this case, the aluminum oxide film 38, results in a reflectance change of only 0.1%.

Figure 5:
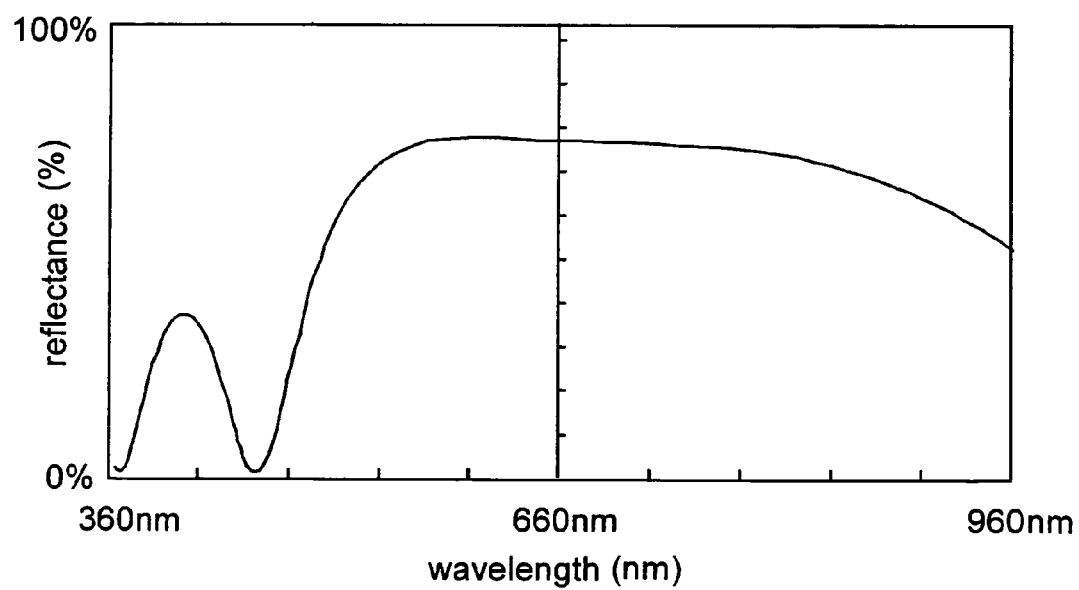
FIG. 5 is a graph showing the wavelength dependence of the reflectance of the rear end of a semiconductor laser according to one embodiment of the present invention, wherein a five-layer film is formed on the rear end face and a silicon oxide film is formed on the five-layer film.

FIG. 5 is a graph showing the wavelength dependence of the reflectance of the rear end of a semiconductor laser according to one embodiment of the present invention, wherein a five-layer film is formed on the rear end face and a silicon oxide film is formed on the five-layer film.

The fifth layer of this five-layer film is an aluminum oxide film 38, which does not necessarily provide satisfactory moisture resistance in an elevated temperature and humidity environment. Therefore, the silicon oxide film 40, which has high moisture resistance, is formed on the aluminum oxide film 38 as a surface protective film. As shown in FIG. 5, when the five-layer film 42 and the silicon oxide film 40 are formed on the rear end face of the semiconductor laser, the rear end has a reflectance of 77.0% to 660 nm wavelength light generated.

For comparison, when only the five-layer film is formed on the rear end face of the semiconductor laser, the rear end has a reflectance of 77.1% to 660 nm wavelength light and the wavelength dependence characteristic curve of the reflectance of the rear end is approximately identical to that shown in FIG. 5.

This means that forming the approximately 5 nm thick silicon oxide film 40 on a reflectance control film, in this case, the five-layer film 42, results in a reflectance change of only 0.1%.

There will now be described the moisture resistance performance of the silicon oxide film 40.

FIGS. 6 to 9 are graphs showing the moisture resistance performances of silicon oxide films having thicknesses of 5 nm, 10 nm, 20 nm, and 50 nm, respectively, in a semiconductor laser according to one embodiment of the present invention.

These moisture resistance performances of the silicon oxide films shown in FIGS. 6 to 9 were obtained using the following steps: forming each silicon oxide film on a 100 nm thick aluminum oxide film to a respective thickness; measuring the reflectance spectrum (indicated by broken line a in each figure) of each silicon oxide film immediately after the above film formation step; performing a moisture resistance test on each silicon oxide film at 120° C. and 100% relative humidity for 100 hours; and measuring the reflectance spectrum (indicated by full line b in each figure) of each silicon oxide film after the above moisture resistance test step. FIGS. 6 to 9 show the measurement results comparing the reflectance spectrum values measured before and after the moisture resistance test.

Figure 6:
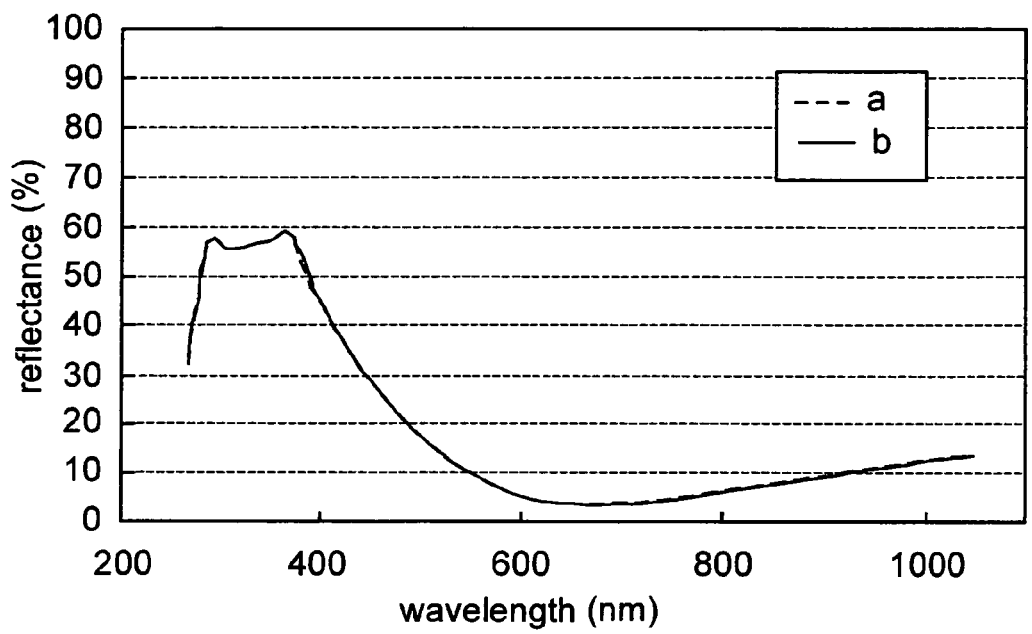
FIGS. 6 to 9 are graphs showing the moisture resistance performances of silicon oxide films having thicknesses of 5 nm, 10 nm, 20 nm, and 50 nm, respectively, in a semiconductor laser according to one embodiment of the present invention.

As shown in FIG. 6, the reflectance spectrum of the 5 nm thick silicon oxide film measured after the moisture resistance test is substantially identical to that measured immediately after the formation of the film. That is, there was substantially no change in the reflectance spectrum, indicating that the silicon oxide film has high moisture resistance.

Figure 7:
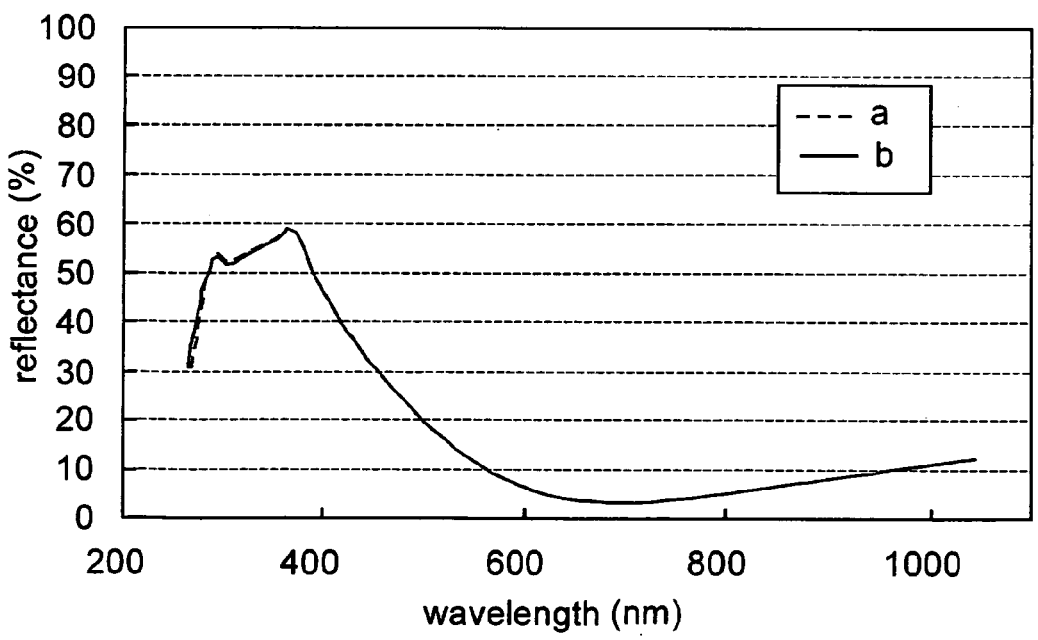
Figure 8:
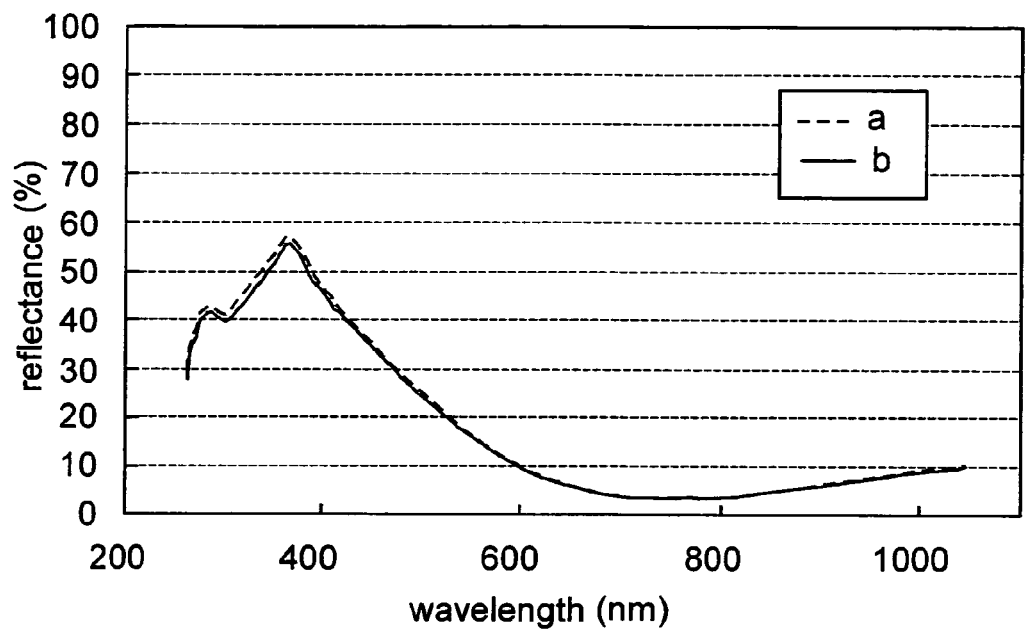
Figure 9:
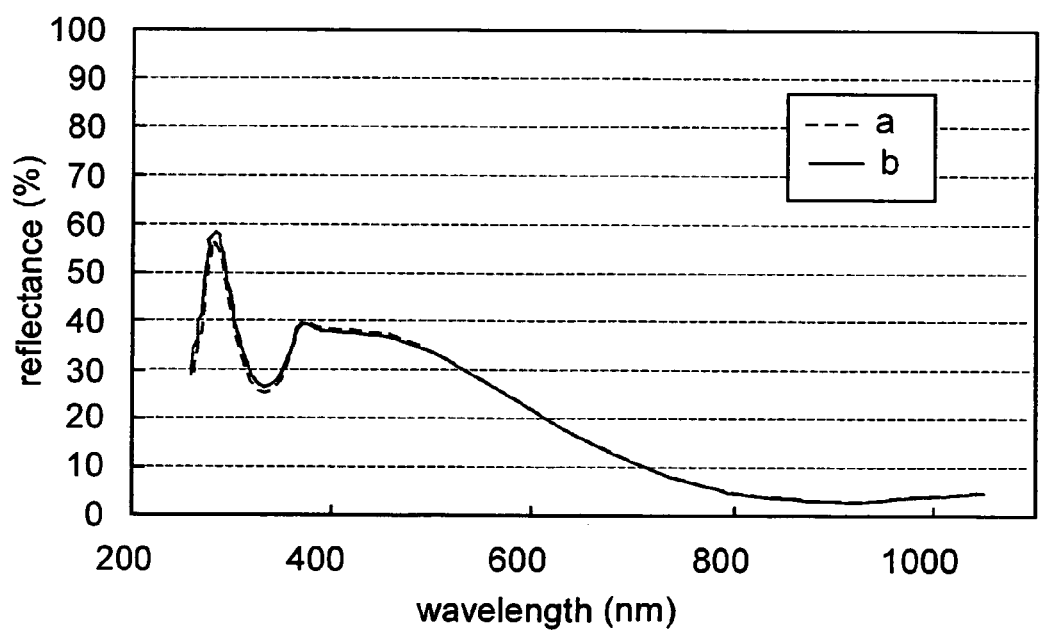
Figure 10:
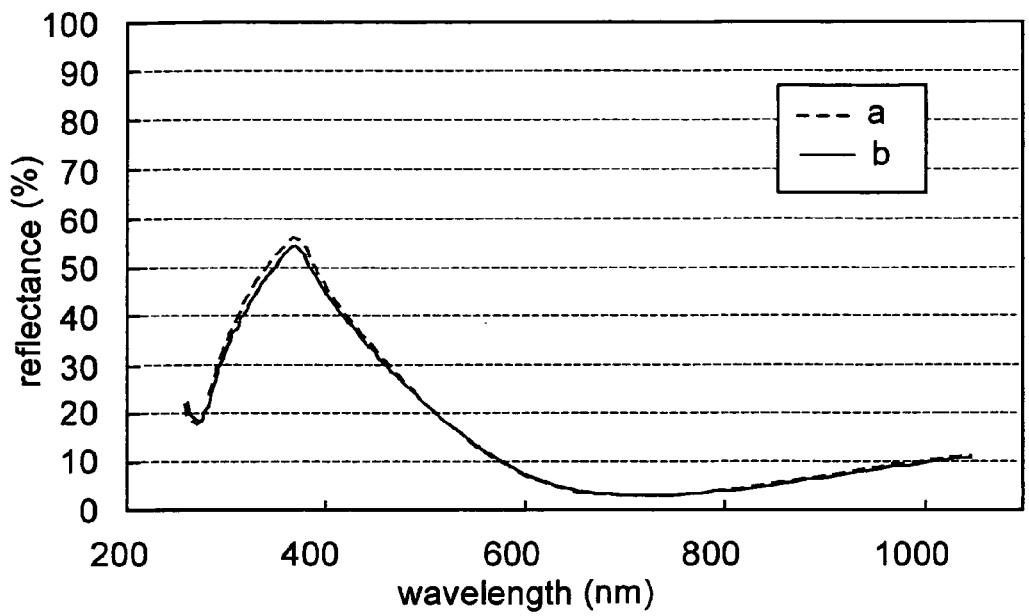
FIGS. 10 to 13 are graphs showing the moisture resistance performances of tantalum oxide films having thickness of 5 nm, 10 nm, 20 nm, and 50 nm, respectively, in a semiconductor laser of one embodiment of the present invention.
Figure 11:
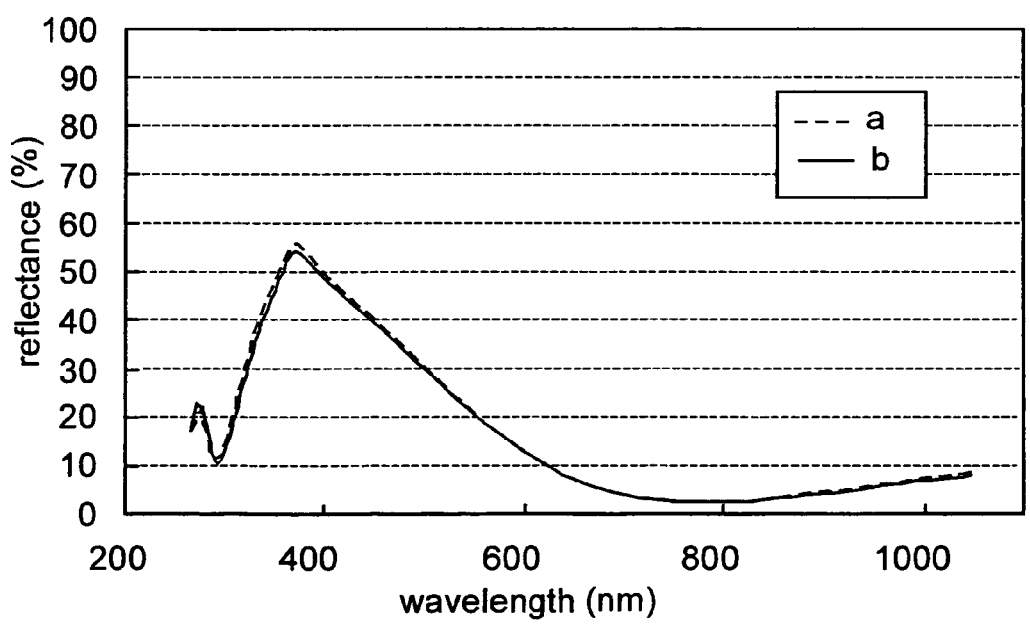
Figure 12:
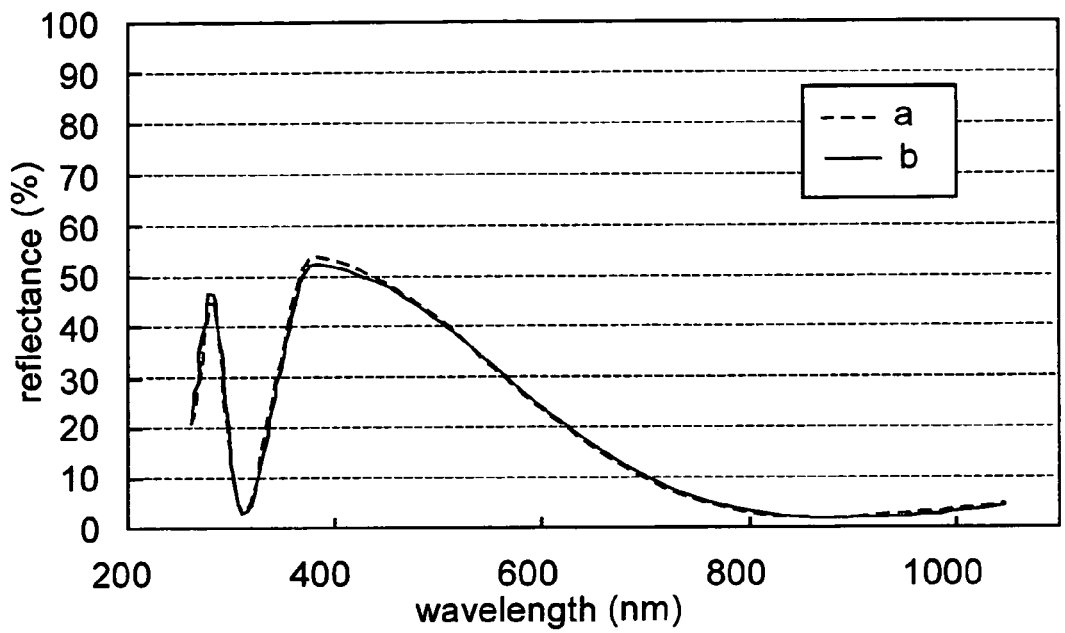
Figure 13:
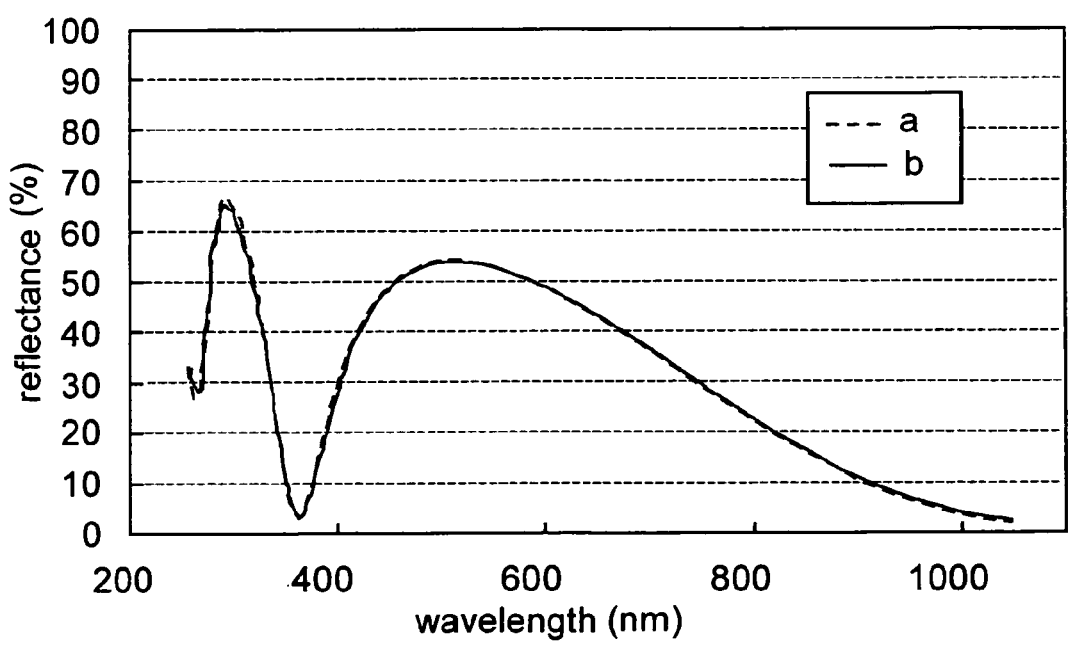

The other silicon oxide films having thicknesses of 10 nm, 20 nm, and 50 nm, respectively, also exhibited this tendency, as shown by the graphs of FIGS. 7 to 9.

However, the magnitudes and shapes of the reflectance spectra of these silicon oxide films were slightly different from one another, since they had different thicknesses. Specifically, although the silicon oxide films having thicknesses of 20 nm or less exhibited substantially the same reference spectrum, the reflectance spectrum of the 50 nm thick silicon oxide film was noticeably different from that of the 20 nm thick silicon oxide film.

Therefore, although according to the present embodiment the thickness of the silicon oxide film 40 is 5 nm, it may be set to more than 5 nm and up to approximately 20 nm to increase the moisture resistance while maintaining sufficient reflectance of the aluminum oxide film.

However, a silicon oxide film having a thickness of approximately 10 nm is preferably used, taking into account the controllability of the silicon oxide film forming process.

Further, the silicon oxide film 40 has lower thermal conductivity than the aluminum oxide film 38 disposed under it. Therefore, from the point of view of heat dissipation, the thinner the silicon oxide film 40, the better in terms of heat dissipation. However, a silicon oxide film with a thickness of approximately 10 nm is still preferably used, taking into account the controllability of the silicon oxide film forming process.

As described above, the silicon oxide film 40 formed on the aluminum oxide film 38 enhances the moisture resistance performance of the front end while maintaining the reflectance of the aluminum oxide film 38. Further, since the silicon oxide film 40 can have a reduced thickness, high heat dissipation can be achieved, thereby preventing the COD degradation of the front surface film 28.

Thus, according to the present embodiment, the silicon oxide (SiOx) film 40 is adherently formed on the aluminum oxide film 38 as a surface protective film. This arrangement prevents the reflectance of the front end from varying even when the temperature of the laser light emitting end face region or front end face region increases due to laser oscillation in the semiconductor laser 10 in a nonhermetic environment containing no inert gas or dry air. As a result, the output characteristics of the semiconductor laser and the reflectance and the film quality of the front surface film do not change, preventing COD degradation.

As described above, forming the silicon oxide film 40 on the aluminum oxide film 38 enhances the moisture resistance performance of the front end, and reducing the thickness of the silicon oxide film 40 increases heat dissipation from the front end. It should be noted that these effects can be achieved not only when an silicon oxide film 40 is formed on the aluminum oxide film 38 but also when it is formed on the five-layer film 42, which is used as the reflectance control film on the rear end face. Note that the front surface film 28 includes an aluminum oxide film 38, and the rear surface film 30 includes the five-layer film 42.

Further, as described in the above patent publications, when a silicon oxide film is used as the top surface layer film of a reflectance control film, it must have a thickness corresponding to the optical length required to achieve predetermined reflectance. This means that the thickness of the silicon oxide film may not be able to be reduced as necessary, which may prevent the entire surface film from achieving high heat dissipation. According to the present embodiment, the front surface film 28 and the rear surface film 30 each includes a thin silicon oxide film (40) as a surface protective film, in addition to the aluminum oxide film 38 or the five-layer film 42.

That is, a surface protective film (a silicon oxide film 40) is provided on the reflectance control film on each end, and this surface protective film is adapted not to affect the reflectance of the reflectance control film. Even if the surface protective film has low thermal conductivity, the entire surface film including the reference control film is allowed to have good heat dissipation characteristics by reducing the thickness of the surface protective film.

Further, since the front surface film 28 and the rear surface film 30 are made up of two separate films, namely, a reflectance control film and a surface protective film which does not affect the reflectance of the reflectance control film, these surface films can provide a sufficient protective shield from the environment of the external medium, for example, an elevated temperature and humidity environment, while maintaining appropriate reflectance. This increases the degree of freedom in the design of the front surface film 28 and the rear surface film 30.

FIGS. 10 to 13 are graphs showing the moisture resistance performances of tantalum oxide films having thickness of 5 nm, 10 nm, 20 nm, and 50 nm, respectively, in a semiconductor laser of one embodiment of the present invention.

That is, whereas FIGS. 6 to 9 show the moisture resistance performances of silicon oxide films, FIGS. 10 to 13 show those of tantalum oxide films.

These moisture resistance performances of the tantalum oxide films were obtained using the following steps: forming each tantalum oxide film on a 100 nm thick aluminum oxide film to a respective thickness; measuring the reflectance spectrum (indicated by broken line a in each figure) of each tantalum oxide film immediately after the above film formation step; performing a moisture resistance test on each tantalum oxide film at 120° C. and 100% relative humidity for 100 hours; and measuring the reflectance spectrum (indicated by full line b) of each tantalum oxide film after the above moisture resistance test step. FIGS. 10 to 13 show the measurement results comparing the reflectance spectrum values measured before and after the moisture resistance test.

In each of FIGS. 10 to 13, the reflectance spectrum of the tantalum oxide film measured after the moisture resistance test is substantially identical to that measured immediately after the formation of the film. That is, there was substantially no change in the reference spectrum, indicating that the tantalum oxide film has high moisture resistance.

Therefore, the front surface film 28 and the rear surface film 30 may include a tantalum oxide film, instead of the silicon oxide film 40 of the present embodiment, producing the same effect.

Figure 14:
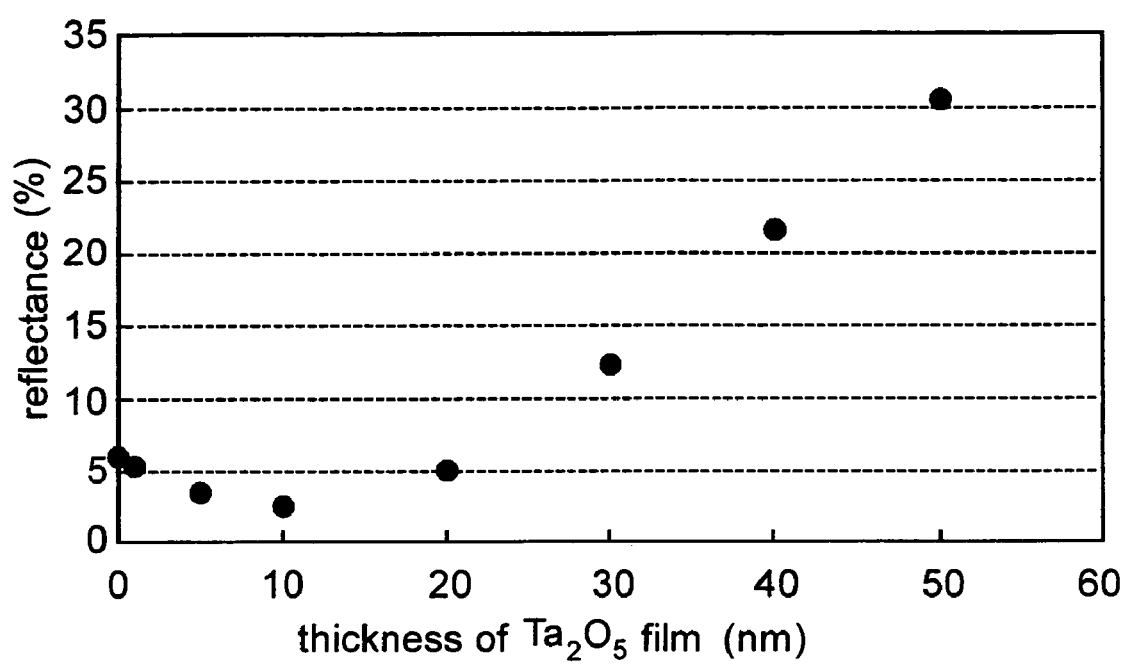
FIG. 14 is a graph showing the relationship between the thickness and the reflectance of a tantalum oxide film of one embodiment of the present invention.

FIG. 14 is a graph showing the relationship between the thickness and the reflectance of a tantalum oxide film of one embodiment of the present invention.

In this example, the first layer of the front surface film is an aluminum oxide film, as in the front surface film 28 of the semiconductor laser 10 having an oscillation wavelength of 660 nm. The aluminum oxide film has a refractive index of 1.645 and a thickness of 83 nm and hence a reflectance of 6%. The above tantalum oxide film having a refractive index of 2.0 is formed on this aluminum oxide film. The graph of FIG. 14 shows the relationship between the thickness and the reflectance of the tantalum oxide film thus formed.

As shown in FIG. 14, the reflectance of the tantalum oxide film does not change very much with its thickness over a thickness range of 20 nm or less. Actually, the reflectance changes from 3% to 6% over this range. However, the rate of change of reflectance with the thickness is high when the thickness exceeds 20 nm.

This tendency is the same as that exhibited by the silicon oxide surface protective film described above. Therefore, the tantalum oxide surface protective film preferably has a thickness of 20 nm or less.

As described above, in the semiconductor laser 10, the semiconductor laser body 36 including the resonator 22 has the front surface film 28 and the rear surface film 30 on its front and rear end faces, respectively. Each surface film includes: a single layer reflectance control film (i.e., an aluminum oxide film 38) or a multilayer reflectance control film including an aluminum oxide film 38 as the top surface layer film; and a silicon oxide film 40 formed on the aluminum oxide film 38 and having a thickness of 20 nm or less. With this arrangement, the silicon oxide film 40 shields the aluminum oxide film 38 from moisture in the air without changing the reflectance of the reflectance control film including the aluminum oxide film. Thus, it is possible to prevent the change in the reflectance of the reflectance control film due to a change in the ambient atmosphere. Further, although the silicon oxide film 40 has lower thermal conductivity than the aluminum oxide film 38, the entire surface film 28 or 30 is allowed to maintain good heat dissipation characteristics by reducing the thickness of the silicon oxide film, resulting in reduced COD degradation.

Thus, the semiconductor laser device of the present embodiment comprises: a semiconductor laser body including a resonator and having a front end face and a rear end face facing each other, the resonator being formed between the front and rear end faces, the front end face emitting principal laser light; a reflectance control film located on the front or rear end face of the semiconductor laser body and made up of either a first dielectric film or a multilayer film including the first dielectric film located such that it is the farthest one of the layers in the multilayer film from the front or rear end face, the first dielectric film having a first thermal conductivity; and a surface protective film located on the first dielectric film of the reflectance control film and having a thickness of 20 nm or less and a second thermal conductivity different from the first thermal conductivity. With this arrangement, the surface protective film disposed on the reflectance control film shields the reflectance control film from the external medium without changing the reflectance of the reflectance control film, thereby preventing the change in the reflectance of the reflectance control film due to a change in the external environment.

Further, even if the surface protective film has low thermal conductivity, the entire surface film including the reflectance control film and the surface protective film is allowed to maintain good heat dissipation characteristics by reducing the thickness of the surface protective film, resulting in reduced COD degradation of the semiconductor laser.

Further, the reflectance control film and the surface protective film are made up of two separate films, namely the reflectance control film and the surface protective film which does not affect the reflectance of the reflectance control film. This increases the degree of freedom in the design of the reflectance control film and the surface protective film.

Thus, it is possible to provide a semiconductor laser device in which surface films having a simple configuration and a reduced tendency to suffer COD degradation are provided on the end faces of the resonator to achieve high reliability.

It should be noted that although the present embodiment has been described with reference to the case where the reflectance control films are aluminum oxide films, the present invention is not limited to this particular arrangement. The reflectance control films may be dielectric films made of an aluminum-containing oxide or nitride such as aluminum nitride, or may be silicon nitride films, producing the same effect as the aluminum oxide films.

Further, although the present embodiment has been described with reference to the case where the surface protective films are formed of silicon oxide (SiOx) or tantalum oxide, the present invention is not limited to surface protective films made of these particular materials. The surface protective films may be formed of a material selected from the group consisting of silicon oxide (SiOx), tantalum oxide, zirconium oxide, niobium oxide, and hafnium oxide, producing the same effect.

Further, although the present embodiment has been described with reference to the case where a reflectance control film and a surface protective film are provided over each of the front and rear end faces of a semiconductor laser, the surface protective film being formed on the reflectance control film, the present invention is not limited to this particular arrangement. Only one of the end faces may have these films thereon.

Thus, the semiconductor laser device of the present invention is suitable for use in electronic information devices.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A semiconductor laser device comprising:
   a semiconductor laser body including a resonator and having a front end face and a rear end face facing each other, said resonator being located between said front and rear end faces, said front end face emitting principal laser light;
   a reflectance control film located on said front end face of said semiconductor body and including a first dielectric film having a first thermal conductivity; and
   a surface protective film located on said first dielectric film of said reflectance control film, with said reflectance control film located between said front end face and said surface protective film, said surface protective film
      having a thickness of no more than 20 nm,
      having a second thermal conductivity, different from the first thermal conductivity,
      being a material selected from the group consisting of silicon oxide, zirconium oxide, tantalum oxide, niobium oxide, and hafnium oxide, and
      being outermost of said films coating said front end face of said semiconductor laser.

2. The semiconductor laser device according to claim 1, wherein said first dielectric film is either an Al-containing dielectric material or silicon nitride.

3. A semiconductor laser device comprising:
   a semiconductor laser body including a resonator and having a front end face and a rear end face facing each other, said resonator being located between said front and rear end faces, said front end face emitting principal laser light;
   a reflectance control film located on said front end face of said semiconductor body and including a first dielectric film of aluminum oxide; and
   a surface protective film located on said first dielectric film of said reflectance control film, with said reflectance control film located between said front end face and said surface protective film, said surface protective film
      having a second thermal conductivity, different from the first thermal conductivity,
      being a material selected from the group consisting of silicon oxide, zirconium oxide, tantalum oxide, niobium oxide, and hafnium oxide, and
      having a thickness of approximately 10 nm.

4. A semiconductor laser device comprising:
   a semiconductor laser body including a resonator and having a front end face and a rear end face facing each other, said resonator being located between said front and rear end faces, said front end face emitting principal laser light;
   a reflectance control film located on said rear end face of said semiconductor body and including a first dielectric film having a first thermal conductivity; and
   a surface protective film located on said first dielectric film of said reflectance control film, with said reflectance control film located between said rear end face and said surface protective film, said surface protective film
      having a thickness of no more than 20 nm,
      having a second thermal conductivity, different from the first thermal conductivity,
      being a material selected from the group consisting of silicon oxide, zirconium oxide, tantalum oxide, niobium oxide, and hafnium oxide, and
      being outermost of said films coating said rear end face of said semiconductor laser.

5. The semiconductor laser device according to claim 4, wherein said first dielectric film is either an Al-containing dielectric material or silicon nitride.

6. The semiconductor laser device according to claim 4, wherein:
   said first dielectric film is an aluminum oxide film; and
   said surface protective film has a thickness of approximately 10 nm.

7. The semiconductor laser device according to claim 4, wherein said reflectance control film is a multi-layer film and said first dielectric film is the layer of said multi-layer film most distant from said rear end face.

* * * * *